US009086997B2

(12) United States Patent
Dodson et al.

(10) Patent No.: US 9,086,997 B2
(45) Date of Patent: Jul. 21, 2015

(54) MEMORY UNCORRECTABLE ERROR HANDLING TECHNIQUE FOR REDUCING THE IMPACT OF NOISE

(71) Applicant: INTERNATIONAL BUSINESS MACHINES CORPORATION, Armonk, NY (US)

(72) Inventors: John Steven Dodson, Austin, TX (US); Benjiman L. Goodman, Cedar Park, TX (US); Stephen J. Powell, Austin, TX (US); Kenneth L. Wright, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 168 days.

(21) Appl. No.: 13/922,365

(22) Filed: Jun. 20, 2013

(65) Prior Publication Data
US 2014/0380095 A1    Dec. 25, 2014

(51) Int. Cl.
*G06F 11/00*     (2006.01)
*G06F 11/14*     (2006.01)

(52) U.S. Cl.
CPC .......... *G06F 11/1402* (2013.01); *G06F 11/141* (2013.01)

(58) Field of Classification Search
CPC ............................ G06F 11/1402; G06F 11/141
See application file for complete search history.

(56) References Cited

U.S. PATENT DOCUMENTS

| 4,503,535 | A | | 3/1985 | Budde et al. | |
| 5,875,201 | A | * | 2/1999 | Bauman et al. | 714/800 |
| 6,467,032 | B1 | | 10/2002 | Lippert | |
| 6,625,755 | B1 | * | 9/2003 | Hirata et al. | 714/17 |
| 7,177,989 | B1 | * | 2/2007 | McGinnis | 711/151 |
| 7,519,752 | B2 | | 4/2009 | Handlogten et al. | |
| 7,934,059 | B2 | | 4/2011 | Papazova et al. | |
| 2009/0003109 | A1 | * | 1/2009 | Thorp et al. | 365/211 |
| 2009/0003110 | A1 | * | 1/2009 | Thorp et al. | 365/211 |
| 2010/0185897 | A1 | | 7/2010 | Abts et al. | |
| 2011/0047440 | A1 | * | 2/2011 | Blackmon et al. | 714/764 |
| 2012/0185733 | A1 | * | 7/2012 | Carman et al. | 714/42 |

* cited by examiner

*Primary Examiner* — Joshua P Lottich
(74) *Attorney, Agent, or Firm* — Mitch Harris, Atty at Law, LLC; Andrew M. Harris; Steven L. Bennett

(57) ABSTRACT

Techniques for handling uncorrectable errors occurring during memory accesses reduce the likelihood of mis-correction of errors due to the presence of noise. When an uncorrectable memory error is detected in response to an access to a memory device, a memory controller managing the interface to the memory halts issuing of access requests to the memory device until a predetermined time period has elapsed. In-flight memory requests are marked for retry, and responses to pending request are flushed. A calibration command may be issued after the predetermined time period has elapsed. After the predetermined time period has elapsed and any calibration performed, the requests marked for retry are issued to the memory device.

14 Claims, 4 Drawing Sheets

MEMORY UNCORRECTABLE ERROR HANDLING TECHNIQUE FOR REDUCING THE IMPACT OF NOISE

BACKGROUND OF THE INVENTION

1. Field of the Invention

The present invention is related to processing systems and processors, and more specifically to techniques for handling uncorrectable memory errors that reduce the impact of noise.

2. Description of Related Art

Present day memory subsystems include substantial error correction mechanisms. The error correction mechanisms make it possible to extend the size, increase the speed and/or reduce the power consumption of memory devices, while maintaining error-free operation via correction of correctable errors and via re-trying occasional uncorrectable errors that occur, i.e., those errors that exceed the capacity of the error-correcting code (ECC) that is employed for error checking and correction.

When uncorrectable errors occur, a typical response is to retry the memory access for which the error occurred, in the hope that the error was due to a transient condition that will not cause a memory error on the second attempt. However, retry of a memory access for which the error has an underlying cause increases the risk that a subsequent read to a different memory location error will also experience an error that will go undetected. Error correction algorithms have a very small but finite mis-correction rate in the presence of errors. Therefore, a subsequent error may not actually be corrected and produce an erroneous value.

Therefore, It would therefore be desirable to provide a memory controller that provides more reliable and robust operation, in particular when uncorrectable memory errors are detected that can be caused by transient noise events.

BRIEF SUMMARY OF THE INVENTION

The invention is embodied in a memory controller and computer system that provide access to memory devices by a processor using a memory controller.

The memory controller includes a bus interface for receiving memory access operations from a bus and a memory device interface for issuing access commands to memory devices in response to the memory access operations. The memory controller also includes a control logic for controlling the bus interface and the memory device interface so that when an uncorrectable error occurs in response to an access command, the memory controller stops issuing access commands to the memory device until a predetermined time period has elapsed. After the predetermined time period has elapsed, the memory controller retries the access to the memory device by reissuing the access command to complete the associated memory access operation.

The foregoing and other objectives, features, and advantages of the invention will be apparent from the following, more particular, description of the preferred embodiment of the invention, as illustrated in the accompanying drawings.

BRIEF DESCRIPTION OF THE SEVERAL VIEWS OF THE DRAWING

The novel features believed characteristic of the invention are set forth in the appended claims. The invention itself, however, as well as a preferred mode of use, further objectives, and advantages thereof, will best be understood by reference to the following detailed description of the invention when read in conjunction with the accompanying Figures, wherein like reference numerals indicate like components, and:

DETAILED DESCRIPTION OF THE INVENTION

The present invention relates to memory controllers and other circuits and computer systems in which uncorrectable errors received from the memory devices in response to access requests trigger a waiting period during which access requests are not sent for a predetermined period of time after an uncorrectable error is detected. By introducing the waiting period, the likelihood that multiple errors due to a momentary noise burst or other temporary cause will yield an erroneous correction is reduced. The methodology improves memory sub-system robustness in the presence of noise, such as power supply noise, which tends to have a duration that can cause multiple uncorrectable errors. In-flight access requests to the memory device are marked for retry and responses to pending requests are flushed. A calibration may optionally be requested after the predetermined wait period has expired. After the predetermined time period has expired and any calibration performed, the access requests marked for retry are re-issued.

Figure 1:
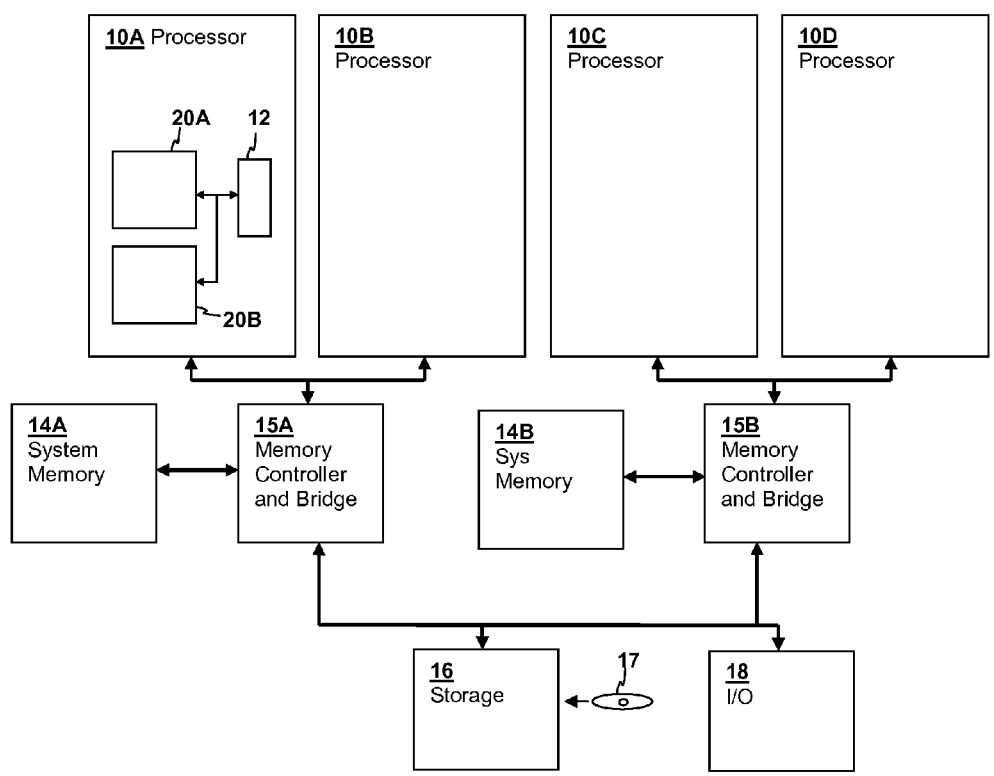
FIG. 1 is a block diagram illustrating a processing system in which techniques according to an embodiment of the present invention are practiced.

Referring now to FIG. 1, a processing system in accordance with an embodiment of the present invention is shown. The depicted processing system includes a number of processors 10A-10D, each coupled to a memory controller/bridge 15A, 15B in conformity with an embodiment of the present invention. The depicted multi-processing system is illustrative, and processing system in accordance with other embodiments of the present invention include uni-processor systems having symmetric multi-threading (SMT) cores. Processors 10A-10D are identical in structure and include cores 20A-20B and cache/local storage 12, which may be a cache level, or a level of internal system memory. Processors 10A-10B are coupled to a main system memory 14A by memory controller/bridge 15A, a storage subsystem 16, which includes non-removable drives and optical drives, for reading media such as a CD-ROM 17 forming a computer program product and containing program instructions implementing operating systems and other software for execution by processors 10A-10D, The illustrated processing system also includes input/output (I/O) interfaces and devices 18 such as mice and keyboards for receiving user input and graphical displays for displaying information. Processors 10C-10D are similarly coupled to main system memory 14B, storage subsystem 16, which includes non-removable drives and optical drives, for reading media such as CD-ROM 17, by memory controller/bridge 15B. While the system of FIG. 1 is used to provide an illustration of a system in which the memory controller architecture of the present invention is implemented, it is understood that the depicted architecture is not limiting and is intended to provide an example of a suitable computer system in which the techniques of the present invention are applied.

Figure 2:
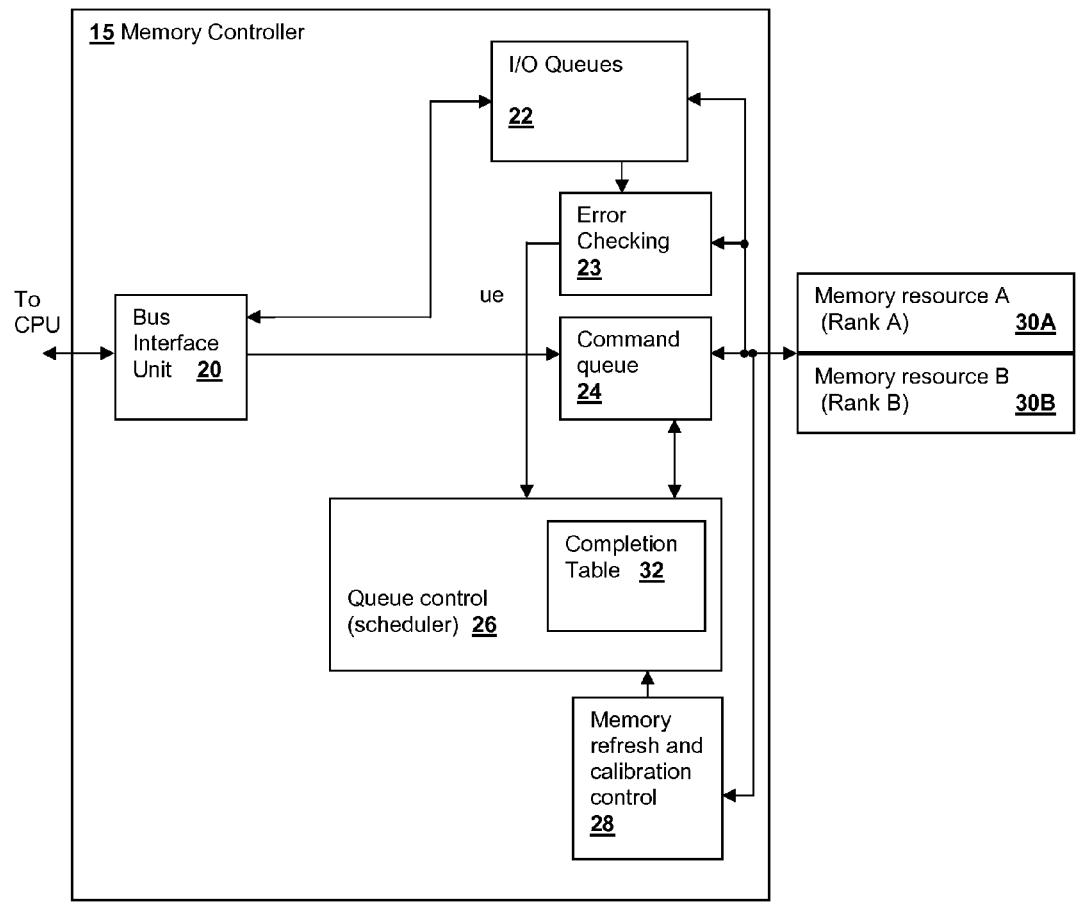
FIG. 2 depicts details of memory controller 15 according to an embodiment of the present invention.

Referring now to FIG. 2 a memory controller 15 in accordance with an embodiment of the invention that can be used to implement memory controllers 15A, 15B of FIG. 1, is shown. Memory controller 15 includes a bus interface unit 20 at which memory access operations are received by memory controller 15 from a bus that connects memory controller 15 to a processor or other external requestor, such as one of processors 10A-10D of FIG. 1. Memory controller 15 is also coupled to memory devices such as a memory resource 30A and a memory resource 30B, which in the example, represent memory devices supporting two ranks, rank A and rank B. Memory resources 30A, 30B and bus interface unit 20 are coupled to I/O queues 22 through which data values are exchanged between memory resources 30A, 30B and the bus. An error checking unit 23 performs error checking on values retrieved from memory resources 30A, 30B. The errors are generally error bits set in the responses to access commands issued to memory resources 30A, 30B, as the error checking is performed within memory resources 30A, 30B using additional parity and/or error-correction bits stored as extension to the values stored in memory resources 30A, 30B. However, in other implementations, error checking may be performed external to memory resources 30A, 30B in accordance with other embodiments of the invention. When error checking unit 23 detects an uncorrectable error indication received from one of memory resources 30A, 30B in response to an access command issued to the memory resources 30A, 30B, an uncorrectable error indication ue is set, which causes a queue control 26 to take action to retry the access command. In accordance with an embodiment of the invention, queue control 26 halts further access to the particular memory resources 30A, 30B for a predetermined time period and takes other actions as described in further detail below.

Memory controller 15 also includes a command queue 24 from which commands are issued to memory resources 30A, 30B and a memory refresh and calibration control 28 that issues commands to memory resources 30A, 30B to recalibrate and periodically to enter refresh cycles as required by memory resources 30A, 30B. A completion table 32 managed by queue control 26 tracks in-flight requests that have been issued to memory resources 30A, 30B as access commands. Queue control 26, in response to determining that an uncorrectable error was received, takes further action by halting the issuance of access commands from command queue 24 to the particular one of memory resources 30A, 30B at which the error occurred (or alternatively all of memory resources 30A, 30B). Queue control 26 further marks all of the in-flight access commands pending in a completion table 32 for the particular memory resources 30A, 30B for retry. Queue control 26 may further flush other responses received in I/O queue 22 from the particular memory resources 30A, 30B. After a predetermined time period has elapsed, queue control 26 directs memory refresh and calibration control 28 to send a calibrate command to the particular memory resources 30A, 30B. Queue control 26 may also direct memory refresh and calibration control 28 to send one or more refresh commands to the particular memory resources 30A, 30B during the predetermined time period, to ensure that the refresh rate specifications of memory resources 30A, 30B are not violated. The above described memory controller 15 is only exemplary, and the memory controller blocks and control logic described above is not limited as to location, for example memory controller 15 can be located within particular devices that implement processors, memory, memory controllers and/or the devices that couple the above-listed device within a processing system according to embodiments of the present invention.

Figure 3:
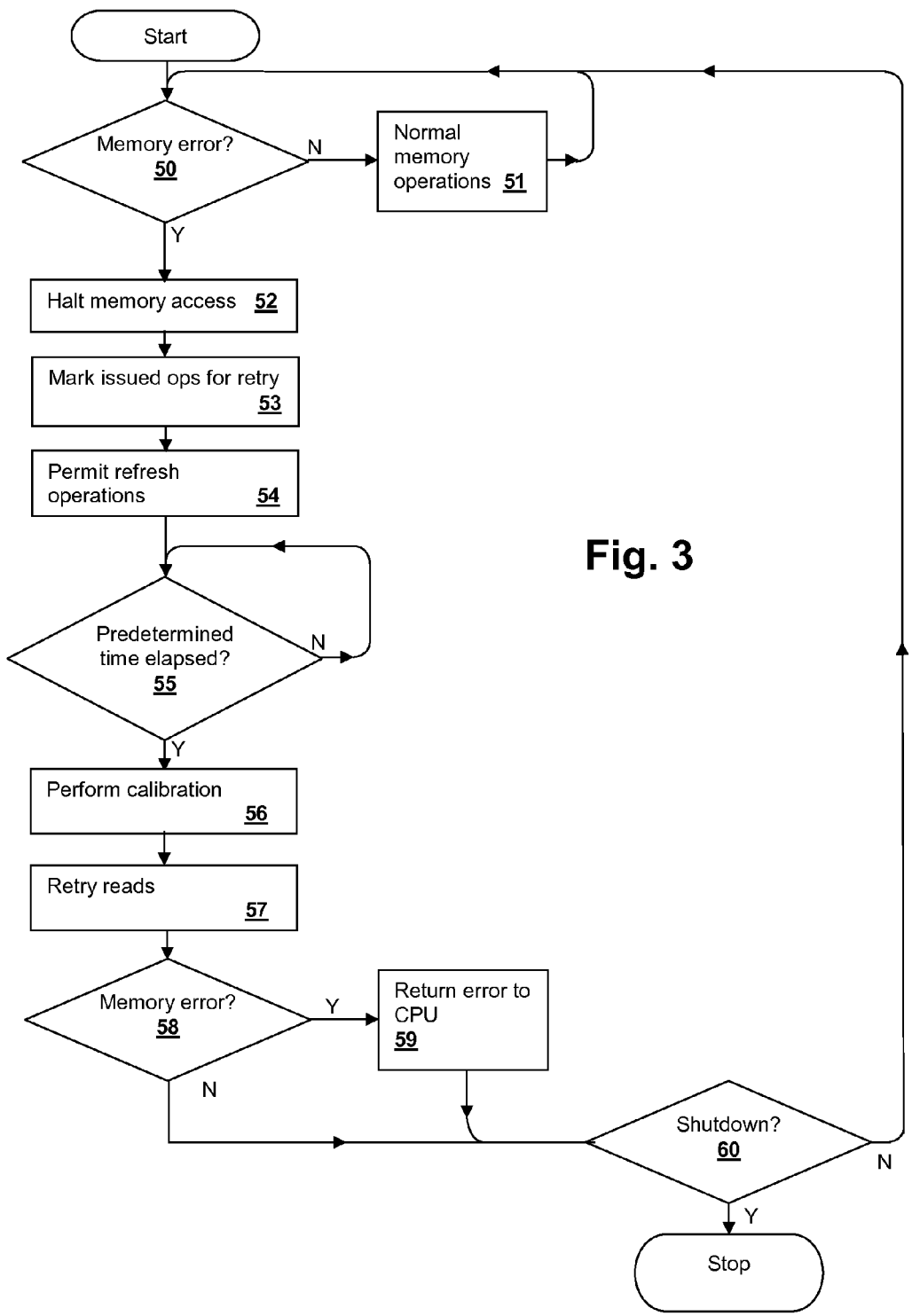
FIG. 3 is a flowchart depicting a method of managing access to a memory device in accordance with an embodiment of the present invention.

Referring now to FIG. 3, a method of managing access to a memory device in accordance with an embodiment of the present invention is illustrated in a flowchart. Until an uncorrectable memory error is received (decision 50), normal memory operation continues (step 51). When an uncorrectable memory error is received (decision 50), memory accesses are halted (step 52), issued memory accesses are marked for retry (step 53) and refresh operations are permitted (step 54). After a predetermined time period, which is generally a static, programmable value, has elapsed (decision 55), a calibration is performed (step 56) and then the read operations that were marked for retry are retried (step 57). If another uncorrectable memory error is received (decision 58), the uncorrectable error is returned to the external requestor (step 59). Until the system is shut down (decision 60), or the software application that was requesting the data is terminated, the method of steps 50-59 are repeated to handle incoming memory accesses.

Figure 4:
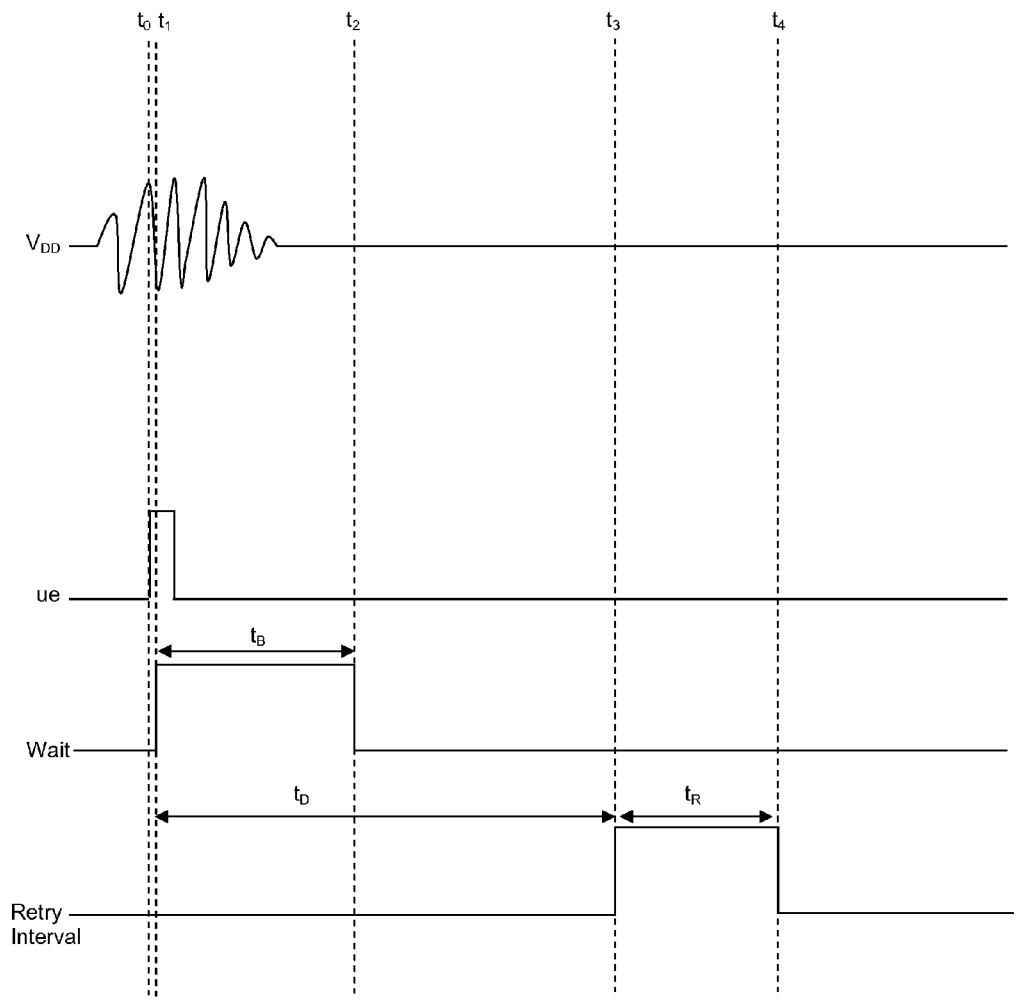
FIG. 4 is a timing diagram depicting operations of a memory controller in accordance with an embodiment of the present invention.

Referring now to FIG. 4, a timing diagram illustrating operation of memory controller 15 is shown. A noise burst occurs in power supply voltage $V_{DD}$, causing an uncorrectable error to occur in response to a memory read access command, resulting in assertion of uncorrectable error indication ue at time $t_0$. At time $t_1$, queue control 26 halts issuing new memory accesses to the memory device, as indicated by the signal Wait, which extends for a time period $t_B$, which is set to a time equal to or longer than the expected duration of noise bursts or other disturbances for the system. The total delay $t_D$, corresponding to the predetermined time period mentioned above, extends from time $t_1$ to time $t_3$, as total delay $t_D$ includes time to complete flushing operations for pending responses from the memory device. At time $t_3$, a retry interval is entered, $t_R$, during which the requests previously marked for retry are retried once. As mentioned above, if a second uncorrectable error occurs, the error is passed up to the external requestor.

While the invention has been particularly shown and described with reference to the preferred embodiments thereof, it will be understood by those skilled in the art that the foregoing and other changes in form, and details may be made therein without departing from the spirit and scope of the invention.

The invention claimed is:

1. A memory controller for managing access to one or more memory devices, comprising:
    a bus interface for receiving memory access operations from a bus;
    a memory device interface for issuing access commands to the one or more memory devices in response to the memory access operations; and
    a control logic for controlling the bus interface and the memory device interface such that when a response to an access command issued to a memory device in response to an associated one of the memory access operations indicates a memory error, the control logic halts issuing access commands to the memory device until a predetermined time period has elapsed, and after the predetermined time period has elapsed, retries the access to the memory device by reissuing the access command to complete the associated memory access operation.

2. The memory controller of claim 1, wherein the control logic further permits refresh operations to continue during the halting.

3. The memory controller of claim 1, wherein the control logic sends a calibration command to the memory device after expiration of the predetermined time period, and waits until completion of a calibration performed in response to the calibration command before reissuing the access command.

4. The memory controller of claim 1, wherein the control logic, in response to when the access indicates the memory error, marks all memory read operations that are in-progress as requiring retry, and wherein the control logic retries the memory read operations marked as requiring retry after the predetermined time period has elapsed.

5. The memory controller of claim 1, wherein the control logic, in response to when the access indicates the memory error, flushes all responses received for memory read operations received from the memory device and marks all of the memory read operations for which responses were flushed as requiring retry, and wherein the control logic retries the memory read operations marked as requiring retry after the predetermined time period has elapsed.

6. The memory controller of claim 1, wherein the control logic, if another response from the memory device received in response to the reissuing of the access command indicates another memory error, responds to the associated memory access operation via the bus interface with an indication that the another memory error occurred.

7. The memory controller of claim 1, wherein the control logic sends a calibration command to the memory device after expiration of the predetermined time period, and waits until completion of a calibration performed in response to the calibration command until reissuing the access command, wherein the control logic, in response to when the access indicates the memory error, marks all memory read operations that are in-progress as requiring retry, wherein the control logic retries the memory read operations marked as requiring retry after the predetermined time period has elapsed, wherein the control logic, in response to when the access indicates the memory error, flushes all responses received for memory read operations received from the memory device and marks all of the memory read operations for which responses were flushed as requiring retry, wherein the control logic retries the memory read operations marked as requiring retry after the predetermined time period has elapsed, and wherein the control logic, if another response from the memory device received in response to the reissuing of the access command indicates a memory error, responding to the associated memory access operation via the bus interface with an indication that the memory error occurred.

8. A computer system, comprising:
   a processor for executing program instructions;
   a memory for storing the program instructions and data; and
   a memory controller for managing access to the memory by the processor, wherein the memory controller comprises a bus interface for receiving memory access operations from a bus, a memory device interface for issuing access commands to the one or more memory devices in response to the memory access operations, and a control logic for controlling the bus interface and the memory device interface such that when a response to an access command issued to a memory device in response to an associated one of the memory access operations indicates a memory error, the control logic halts issuing access commands to the memory device until a predetermined time period has elapsed, and after the predetermined time period has elapsed, retries the access to the memory device by reissuing the access command to complete the associated memory access operation.

9. The computer system of claim 8, wherein the control logic further permits refresh operations to continue during the halting.

10. The computer system of claim 8, wherein the control logic sends a calibration command to the memory device after expiration of the predetermined time period, and waits until completion of a calibration performed in response to the calibration command before reissuing the access command.

11. The computer system of claim 8, wherein the control logic, in response to when the access indicates the memory error, marks all memory read operations that are in-progress as requiring retry, and wherein the control logic retries the memory read operations marked as requiring retry after the predetermined time period has elapsed.

12. The computer system of claim 8, wherein the control logic, in response to when the access indicates the memory error, flushes all responses received for memory read operations received from the memory device and marks all of the memory read operations for which responses were flushed as requiring retry, and wherein the control logic retries the memory read operations marked as requiring retry after the predetermined time period has elapsed.

13. The computer system of claim 8, wherein the control logic, if another response from the memory device received in response to the reissuing of the access command indicates another memory error, responds to the associated memory access operation via the bus interface with an indication that the another memory error occurred.

14. The computer system of claim 8, wherein the control logic sends a calibration command to the memory device after expiration of the predetermined time period, and waits until completion of a calibration performed in response to the calibration command until reissuing the access command, wherein the control logic, in response to when the access indicates the memory error, marks all memory read operations that are in-progress as requiring retry, wherein the control logic retries the memory read operations marked as requiring retry after the predetermined time period has elapsed, wherein the control logic, in response to when the access indicates the memory error, flushes all responses received for memory read operations received from the memory device and marks all of the memory read operations for which responses were flushed as requiring retry, wherein the control logic retries the memory read operations marked as requiring retry after the predetermined time period has elapsed, and wherein the control logic, if another response from the memory device received in response to the reissuing of the access command indicates a memory error, responding to the associated memory access operation via the bus interface with an indication that the memory error occurred.

* * * * *